United States Patent [19]

Rawcliffe et al.

[11] 4,021,724

[45] May 3, 1977

[54] APPARATUS FOR USE IN DETERMINING A CHARACTERISTIC OF A CATHODE RAY TUBE

[75] Inventors: John Rawcliffe, Atherton, near Manchester; John McLauchlan Vassie, Barnston, Wirral, both of England

[73] Assignee: Elliott Brothers (London) Limited, Chelmsford, England

[22] Filed: Dec. 29, 1975

[21] Appl. No.: 644,630

[30] Foreign Application Priority Data

Jan. 2, 1975  United Kingdom .................. 53/75

[52] U.S. Cl. ......................... 324/20 CR; 250/201; 250/549; 315/10
[51] Int. Cl.$^2$ ..................................... G01R 31/024
[58] Field of Search ................. 324/20 CR; 315/10; 250/549, 201

[56] References Cited

UNITED STATES PATENTS

| | | | |
|---|---|---|---|
| 2,799,825 | 7/1957 | Hardy | 324/20 CR |
| 3,188,477 | 6/1965 | Ault | 324/20 CR |

*Primary Examiner*—Rudolph V. Rolinec
*Assistant Examiner*—Michael J. Tokar
*Attorney, Agent, or Firm*—Kirschstein, Kirschstein, Ottinger & Frank

[57] ABSTRACT

Test apparatus for a cathode ray tube has optical elements disposed along two optical paths from the screen of a cathode ray tube to two photosensors. One optical path passes through a graticule which has a pattern of light transmissive and non-transmissive areas. The real image of a luminous spot on the screen is accurately positioned on a boundary between two of the areas of the graticule by deriving a control signal from a comparison of the photosensor outputs.

7 Claims, 2 Drawing Figures

APPARATUS FOR USE IN DETERMINING A CHARACTERISTIC OF A CATHODE RAY TUBE

This invention relates to apparatus for use in determining the characteristic of a cathode ray tube relating luminous spot position to deflection current.

Conventionally the aforesaid characteristic is determined by positioning the spot in a number of places over the tube face and measuring the spot position by a travelling microscope. The current flowing in the deflection windings of the cathode ray tube is recorded for each spot position so identified; and detailed analysis of the matrix of values relating spot position with current value enables the tube quality to be assessed.

The aforesaid method suffers from certain disadvantages. Firstly, the method is slow and estimation of the spot center requires a subjective decision which may be difficult where the spot is not of uniform brightness distributiion. Secondly, estimation of spot width is also subjective and is made more difficult by non-uniform spot characteristics.

Accordingly the present invention, provides apparatus for use in ascertaining the characteristic of a cathode ray tube relating luminous spot position to deflection current comprising:

a locating means for a cathode ray tube; optical means which define a first optical path between the screen of a cathode ray tube located by said locating means and a first photo-sensor; a graticule disposed in said first optical path, said graticule containing a predetermined spatial distribution of light transmissive and non-transmissive areas, the first optical path including imaging means operative to form a real image of a luminous spot on said cathode ray tube screen at a corresponding position on said graticule; further optical means which define a second optical path between the screen of the cathode ray tube and a second photosensor, a first signal comparator responsive to the outputs from said first and second photo-sensors; means responsive to the output of said first comparator for producing a signal for application to a beam deflection means of the cathode ray tube to position said image of the spot on the graticule such that the outputs produced by said first and second photo-sensors are in a predetermined relationship.

Preferably the apparatus further comprises means for causing said spot on the screen of the cathode ray tube and hence said image of the spot on the graticule to move to different positions in which the outputs produced by said first and second photo-sensors are in said predetermined relationship.

Preferably said means for causing said spot on the screen of the cathode ray tube to move to different positions comprises a cyclic ramp generator for supplying or controlling the current to the beam deflection means so as to deflect the luminous spot in a direction at right angles to the direction in which the spot moves in response to the photo-sensor outputs, and a comparator which is connected at its input to the output of said cyclic ramp generator and is adapted to receive at another input programmed positioning signals;

and wherein at equality between the ramp waveform and a programmed signal said comparator develops an output for use in enabling bright-up circuitry of the cathode ray tube.

One apparatus in accordance with the invention is hereinafter described by way of example with reference to the accompanying drawings in which.

Figure 1:
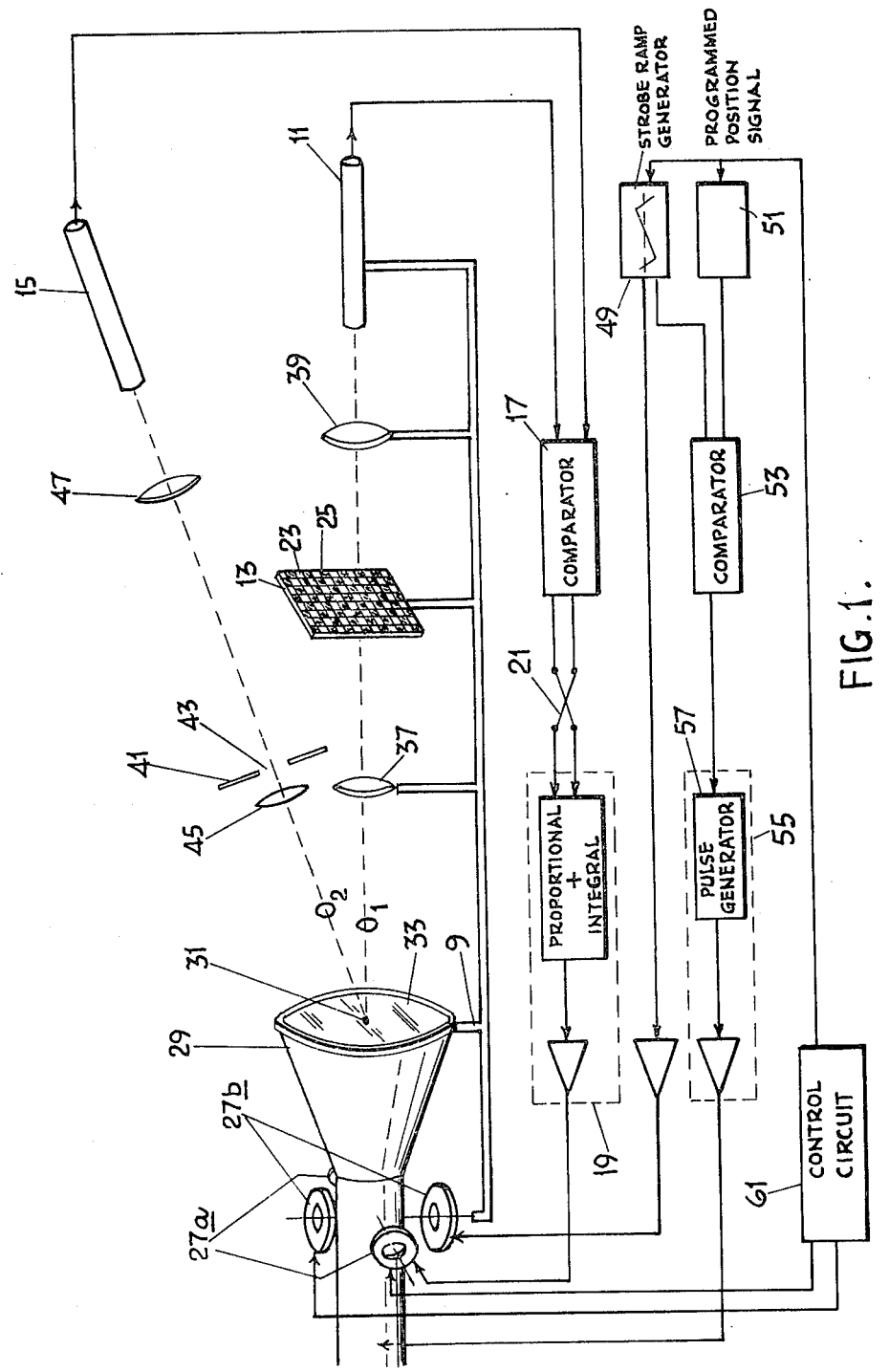
FIG. 1 is a block schematic diagram of the apparatus.

Referring to FIG. 1 the apparatus comprises a photo-sensor 11, a field lens 39, a graticule 25 and an objective lens 37 which lie along an optical path $O_1$ extending from the screen 33 of a cathode ray tube 29. The cathode ray tube 29 is shown in FIG. 1 located at the appropriate position and supported by a locating and supporting arrangement 9 which forms part of the apparatus. The apparatus further comprises a second photosensor 15 lying along a second optical path $O_2$ from the screen 33 of the cathode ray tube, and a signal comparator 17 connected to the outputs of the photosensors 11 and 15. Deflection control circuitry 19 is connected to the output of the comparator 17 by way of a reversing switch 21.

Figure 2:
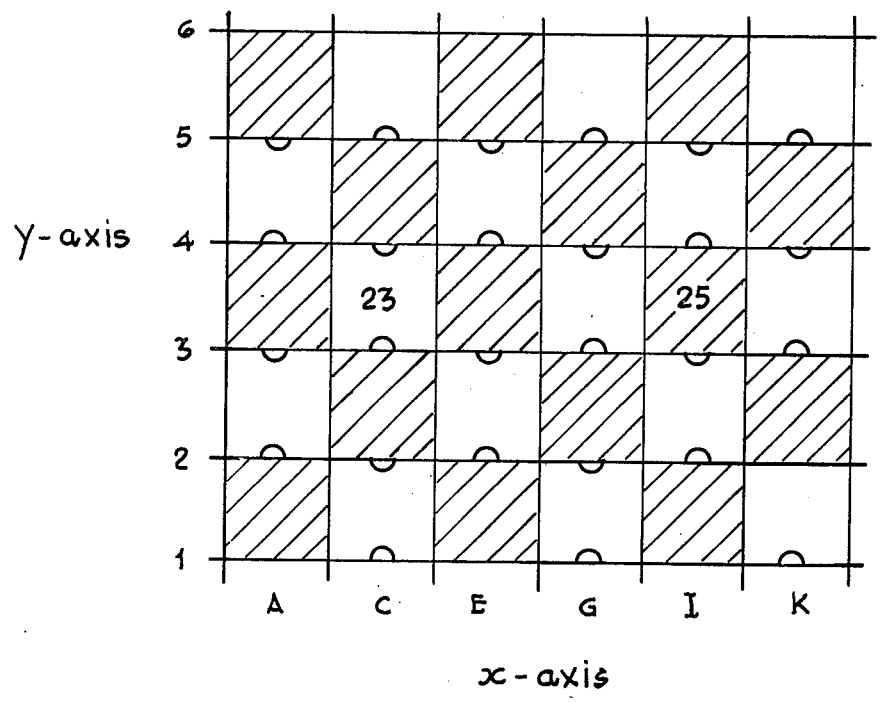
FIG. 2 shows an enlarged portion of a graticule used in the apparatus of FIG. 1.

Referring to FIG. 2, the graticule 13 contains a predetermined spatial distribution of light transmissive and non-transmissive areas 23 and 25 respectively. As shown the graticule 13 has a chequered pattern of alternating light transmissive areas; but it should be understood that other distributions may be utilized. Indeed, provided that the positions of the transmissive and non-transmissive areas are known the distribution may take any suitable form.

The deflection control circuitry 19 in response to an output from the comparator 17 develops an output signal for producing or controlling the production of a current in deflection windings 27a for deflecting the electron beam of a cathode ray tube 29 when such a tube is supported by the locating means 9.

With the cathode ray tube 29 energized so as to produce a luminous spot, as 31, at the screen 33 thereof a real image of the spot 31 is produced at the graticule 13. At least a fraction of any light transmitted through the graticule 13 (as a result of the real image 35 (in FIG. 2) or a part thereof being coincident with a light transmissive area 23) is incident on the photosensor 11.

As may be seen the real image 35 is produced from the spot 31 by the objective lens 37. The field lens 39 directs light transmitted by the graticule 13 to the photosensor 11.

It will be appreciated that production of the real image 35 may be achieved by other means. For example a zone plate, though less efficient as a focussing device, might be employed provided that the photosensor 11 is of adequate sensitivity. Further it might be possible to dispense entirely with the field lens 39 by providing a graticule 13 which has a coating of photosensitive substance adherent thereto.

Light propagated along the second optical path $O_2$ passes through an aperture 43 of a member 41. The member 41 is in the form of an iris so as to permit adjustment of the size of the aperture 43. Intercepting the optical path $O_2$ is an objective lens 45 and a field lens 47. As with the optical path $O_1$ other optical arrangements are possible.

The difference signal from the comparator 17, in response to the outputs of the photosensors 11 and 15 is, after filtering by deflection control circuitry 19, applied to the deflection windings 27a.

The transfer function of the deflection control circuitry 19 is such that when a real image 35 of the luminous spot is present on the graticule the current in the windings 27a varies until a predetermined fraction only of the real image 35 is coincident with a light transmissive area 23, the remainder of the image then being coincident with the contiguous non-transmissive area 25 of the graticule 13. The aforesaid transfer function has, essentially, a proportional component and a pseudo-integral or low band-pass component to ensure that the real image 35 is driven so as to reduce the difference signal from the comparator 17 to zero within fine limits of accuracy, thereby ensuring accurate positioning of the real image 35 with respect to a particular boundary between transmissive and non-transmissive areas of the graticule.

In practice it is desirable that the predetermined fraction of the real image 35 which is coincident with the light transmissive area is such that one half of the total light flux from the real image is transmitted through the light transmissive area. Accordingly, prior to commencing the calibration of a cathode ray tube, with the spot 31 so positioned that the total area of the real image is coincident with a light transmissive area 23 of the graticule 13, the member 41 is adjusted so that the aperture 43 is of a size such that the output from the photosensor 15 is equal to one half of that from the photosensor 11.

With the apparatus so far described, a simple calibration programme may be carried out. A fixed, known current is passed under the control of a control circuit 61 through the deflection windings 27b giving the luminous spot 31 a position in the x-direction such that its real image on the graticule lies in, say, column A of the graticule pattern shown in FIG. 2. The current in deflection windings 27a is then subjected to incremental changes by the control circuit 61 so that the image of the luminous spot moves successively to light transmissive areas in the y-direction along column A. Once incident on a light transmissive area, say that bounded by horizontal boundaries 2 and 3 of FIG. 2, the image of the luminous spot is move by the deflection control circuitry 19 controlled by the output of comparator 17 so that it is accurately placed on the boundary 2 or 3 as described above. The direction that the spot moves is determined by the reversing switch 21, so that if the image initially aligns on the boundary 2 in column A, the reversing switch 21 is then reversed so that the image aligns with boundary 3. In this way two y-direction current values are obtained for each positioning of an image in a light transmissive area. The process is repeated in the other columns, and then the deflection windings connections are interchanged and the whole process is repeated to give x-direction current values for fixed y values.

The addition of further apparatus allows a more sophisticated calibration programme to be carried out. This apparatus comprises a strobe ramp generator 49 and a programmed spot position signal generator 51 (which may constitute, with the control circuit 61, part of a digital computer). The strobe ramp generator 51 is shown connected to the cathode ray tube deflection windings 27b and thus controls movement of the luminous spot in the x-direction. The outputs from generator 49 and generator 51 provide the inputs to a comparator 53 whose output is connected to the bright-up circuitry of the cathode ray tube.

Upon commencement of the programme the bright-up circuitry is not enabled and the deflection of a spot is purely notional. During the period of a strobe signal the notional spot undergoes deflection in the x-direction, and when the amplitude of this strobe signal equals the amplitude of one of a number of positioning signals of differing amplitude supplied by the generator 51 under the control of the control circuit 61, the comparator 53 responds by developing a pulse which enables the bright up circuitry of the cathode ray tube.

The programmed positioning signals are predetermined by approximate computation so as to correspond to those values of the x-direction deflection current, i.e., in windings 27b, that produce an image of the luminous spot incident on a vertical boundary of the graticule. Thus an enabling pulse is produced by comparator 53 and a spot appears on the screen at each point along the path of the notional spot parallel to the x-axis when that path crosses a vertical boundary.

The enabling pulse for the comparator 53 must have a duration short enough to prevent the spot being present on the screen so long that its image is incident with the next vertical boundary of the graticule, but it must be long enough to ensure that the deflection control circuitry 19 has sufficient time to position the spot so that its image is accurately positioned, i.e., at 50% cut-off, with respect to the appropriate portion of the horizontal boundary.

By way of example, the procedure will be described with reference to FIG. 2. Initially the current in deflection windings 27a is approximately adjusted such that the spot, when present, would have its image adjacent the boundary 2. This adjustment is made in order to decrease the movement required to be produced by the deflection control circuitry 19. When the deflection produced by the strobe signal is such that the image of the spot, if present, would be crossing the vertical boundary entering into column A, the spot is brightened up, and then under the control of the deflection control circuitry is accurately positioned on the portion of boundary 2 that is in column A. The spot is then extinguished and brightened-up again as it enters column B. The reversing switch 21 is controlled by the control circuit 61 so as to reverse at successive boundaries and so to move the spot in the required direction in each column.

In this way a series of current values for deflection in the y-direction are obtained for various positions of the image of the spot along a straight line on the graticule and correspondingly on the screen.

The procedure is repeated for horizontal boundaries 3, 4, etc., and is then completely repeated with the deflection windings interchanged, to give current values for deflection in the x-direction. From these results a complete matrix relating spot position to deflection current can be defined.

After sampling the deflection current values corresponding to the various spot positions so as to derive digital representation of the said current values the spot position/deflection current matrix may, using a digital computer, on-line or otherwise, be analysed and output data provided indicating the tube spot position/deflection current characteristic or indicating on the basis of a test criterion or test criteria, including in the computer program, whether or not the cathode ray tube is acceptable.

It should be understood that the deflection windings 27a and 27b may be supplied as component elements of the cathode ray tube; or they may be standard windings which form part of the apparatus and which are adapted to receive a tube devoid of its own deflection windings.

We claim:

1. Apparatus for use in ascertaining the characteristic of a cathode ray tube relating luminous spot position to deflection current, said apparatus comprising:
   A. a locating means for a cathode ray tube;
   B. a first photosensor;
   C. optical means defining a first optical path between the screen of a cathode ray tube located by said locating means and the first photosensor;
   D. a graticule disposed in said first optical path,
      i. said graticule containing a predetermined spatial distribution of light transmissive and non-transmissive areas,
      ii. the first optical path including imaging means operative to form a real image of a luminous spot on said cathode ray tube screen at a corresponding position on said graticule so that the output of said first photosensor has a value dependent on the position of said spot on the cathode ray tube screen;
   E. a second photosensor;
   F. further optical means which defines a second optical path between the screen of the cathode ray tube and the second photosensor,
      i. said second optical path having a predetermind constant light transmissivity so that the output of said second photosensor has a constant value independent of the position of said spot on said cathode ray tube screen;
   G. a first signal comparator responsive to the outputs from said first and second photosensors; and
   H. means responsive to the output of said first comparator for producing a signal for application to a beam deflection means of the cathode ray tube to position said spot and hence said image of the spot on the graticule such that the outputs produced by said first and second photosensors are in a predetermined relationship.

2. Apparatus as claimed in claim 1 which further comprises means for causing said spot on the screen of the cathode ray tube and hence said image of the spot on the graticule to move the different positions in which the outputs produced by said first and second photosensors are in said predetermined relationship.

3. Apparatus as claimed in claim 2 wherein said means for causing said spot on the screen of the cathode ray tube to move to different positions comprises a cyclic ramp generator for supplying or controlling the current to the beam deflection means so as to deflect the luminous spot in a direction at right angles to the direction in which the spot moves in response to the photosensor outputs, and a comparator which is connected at its input to the output of said cyclic ramp generator and is adapted to receive at another input programmed positioning signals; and wherein at equality between the ramp waveform and a programmed signal said comparator develops an output for use in enabling bright-up circuitry of the cathode ray tube.

4. Apparatus according to claim 1 wherein said predetermined spatial distribution of light transmissive and non-transmissive areas contained in the graticule is in the form of a chequered pattern of alternating light transmissive and non-transmissive areas.

5. Apparatus as claimed in claim 1 wherein means are provided for setting the light transmissivity of said second optical path, such that when said image of the luminous spot falls wholly on a light transmissive area of the graticule then the output produced by the second photosensor is half that produced by the first photosensor.

6. Apparatus as claimed in claim 5 wherein said means provided for setting the light transmissivity of said second optical path comprises a variable aperture diaphragm disposed in said second optical path.

7. Apparatus as claimed in claim 6 wherein said predetermined relationship between the outputs produced by said first and second photosensors is the output produced by the first photosensor is equal to the output produced by the second photosensor.

* * * * *